(12) United States Patent
Guo

(10) Patent No.: US 12,727,467 B2
(45) Date of Patent: Sep. 1, 2026

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei City (CN)

(72) Inventor: Shuai Guo, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 568 days.

(21) Appl. No.: 18/364,487

(22) Filed: Aug. 3, 2023

(65) Prior Publication Data

US 2024/0071916 A1 Feb. 29, 2024

Related U.S. Application Data

(63) Continuation of application No. PCT/CN2022/124157, filed on Oct. 9, 2022.

(30) Foreign Application Priority Data

Aug. 29, 2022 (CN) ........................ 202211042055.X

(51) Int. Cl.

| | |
|---|---|
| ***H10W 20/43*** | (2026.01) |
| ***H10P 50/00*** | (2026.01) |
| ***H10W 20/00*** | (2026.01) |

(52) U.S. Cl.

CPC ........... *H10W 20/43* (2026.01); *H10P 50/691* (2026.01); *H10P 50/73* (2026.01); *H10W 20/056* (2026.01);

(Continued)

(58) Field of Classification Search

CPC . H10W 20/43; H10W 20/056; H10W 20/075; H10B 43/50; H10P 50/73

See application file for complete search history.

(56) References Cited

U.S. PATENT DOCUMENTS 8,822,285 B2 * 9/2014 Hwang .................. H10B 41/20 438/257
9,070,447 B2 * 6/2015 Chen ...................... H10B 43/35

(Continued)

FOREIGN PATENT DOCUMENTS

CN 102583225 A 7/2012
CN 106206447 A 12/2016

(Continued)

OTHER PUBLICATIONS

International Search Report cited in PCT/CN2022/124157 mailed Dec. 20, 2022, 9 pages.

*Primary Examiner* — Bac H Au
(74) *Attorney, Agent, or Firm* — Syncoda LLC; Feng Ma

(57) ABSTRACT

The present disclosure provides a manufacturing method of a semiconductor structure and a semiconductor structure, and relates to the technical field of semiconductors. The manufacturing method of a semiconductor structure includes: providing a substrate, and forming a stacked structure on the substrate; forming a hard mask layer on the stacked structure, where the hard mask layer includes a first etched window, and the first etched window exposes part of a top surface of the stacked structure; forming a photoresist layer, where the photoresist layer covers the first etched window; and trimming the photoresist layer for a plurality of times, after each trimming of the photoresist layer, etching the stacked structure according to a trimmed photoresist layer, and forming a plurality of steps in the stacked structure along a direction away from the substrate.

10 Claims, 11 Drawing Sheets

(52) U.S. Cl.
CPC ....... *H10W 20/075* (2026.01); *H10W 20/076* (2026.01)

(56) References Cited

U.S. PATENT DOCUMENTS

| | | | | |
|---|---|---|---|---|
| 9,406,609 | B1 * | 8/2016 | Lung | H10W 20/056 |
| 9,548,359 | B2 * | 1/2017 | Hong | H10D 62/122 |
| 9,941,153 | B1 * | 4/2018 | Yang | H10W 20/089 |
| 10,763,275 | B2 | 9/2020 | Hu et al. | |
| 10,790,299 | B2 * | 9/2020 | Shim | H10B 43/10 |
| 10,818,508 | B2 * | 10/2020 | Lo | H10P 50/73 |
| 2013/0341797 | A1 * | 12/2013 | Lim | H10W 20/089 257/E21.585 |
| 2014/0057429 | A1 | 2/2014 | Oh et al. | |
| 2016/0093513 | A1 * | 3/2016 | Hong | H10P 50/71 438/696 |
| 2016/0322374 | A1 * | 11/2016 | Sano | H10B 41/27 |
| 2016/0329345 | A1 * | 11/2016 | Hu | H10B 43/27 |
| 2018/0247955 | A1 * | 8/2018 | Iida | H10B 43/10 |
| 2018/0342530 | A1 * | 11/2018 | Lindsay | H10B 43/27 |
| 2018/0374702 | A1 * | 12/2018 | Chang | H10P 76/4085 |
| 2019/0074189 | A1 * | 3/2019 | Park | H10P 50/283 |
| 2020/0381294 | A1 * | 12/2020 | Kibi | H10P 50/73 |
| 2021/0036007 | A1 * | 2/2021 | Oh | H10B 43/27 |
| 2022/0157829 | A1 * | 5/2022 | Cao | H10B 12/488 |

FOREIGN PATENT DOCUMENTS

| | | | |
|---|---|---|---|
| CN | 110783341 | A | 2/2020 |
| CN | 113540040 | A | 10/2021 |
| CN | 112968029 | B | 6/2022 |

* cited by examiner 250
500
250
300
210-M
210-M-1
202
201
202
201
202
201
202
201
210-2
210-1
202
201
110
100

MANUFACTURING METHOD OF SEMICONDUCTOR STRUCTURE AND SEMICONDUCTOR STRUCTURE

CROSS-REFERENCE TO RELATED APPLICATIONS

This is a continuation of International Patent Application No. PCT/CN2022/124157, filed on Oct. 9, 2022, which claims priority to Chinese Patent Application No. 202211042055.X, titled "MANUFACTURING METHOD OF SEMICONDUCTOR STRUCTURE AND SEMICONDUCTOR STRUCTURE" and filed on Aug. 29, 2022. The disclosures of International Patent Application No. PCT/CN2022/124157 and Chinese Patent Application No. 202211042055.X are incorporated herein by reference in their entireties.

TECHNICAL FIELD

The present disclosure relates to, but is not limited to, a manufacturing method of a semiconductor structure and a semiconductor structure.

BACKGROUND

With continuous development of semiconductor chips, key dimensions of the semiconductor chips are continuously reduced. However, due to limitations of photolithography steppers, there is a limit to the reduction of dimensions of the semiconductor chips. Currently, to improve storage density of the semiconductor chip, the semiconductor chip has developed from a planar structure to a three-dimensional structure.

However, for a three-dimensional memory, steps need to be formed to implement connections between different layers of structures or devices. A larger quantity of layers of the three-dimensional memory indicates a larger region occupied by the steps and a smaller area of a core region of the three-dimensional memory, which limits further improvement of the storage density of the three-dimensional memory.

SUMMARY

An overview of the subject described in detail in the present disclosure is provided below, which is not intended to limit the protection scope of the claims.

The present disclosure provides a manufacturing method of a semiconductor structure and a semiconductor structure.

A first aspect of the present disclosure provides a manufacturing method of a semiconductor structure. The manufacturing method of a semiconductor structure includes:

- providing a substrate, and forming a stacked structure on the substrate;
- forming a hard mask layer on the stacked structure, where the hard mask layer includes a first etched window, and the first etched window exposes part of a top surface of the stacked structure;
- forming a photoresist layer, where the photoresist layer covers the first etched window; and
- trimming the photoresist layer for a plurality of times, after each trimming of the photoresist layer, etching the stacked structure according to a trimmed photoresist layer, and forming a plurality of steps in the stacked structure along a direction away from the substrate.

A second aspect of the present disclosure provides a semiconductor structure. The semiconductor structure is manufactured according to the manufacturing method of a semiconductor structure described in the first aspect of the present disclosure. The semiconductor structure includes:

- a substrate; and
- a stacked structure arranged on the substrate, where a plurality of steps are arranged in the stacked structure along a direction away from the substrate.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

REFERENCE NUMERALS

Figure 1:
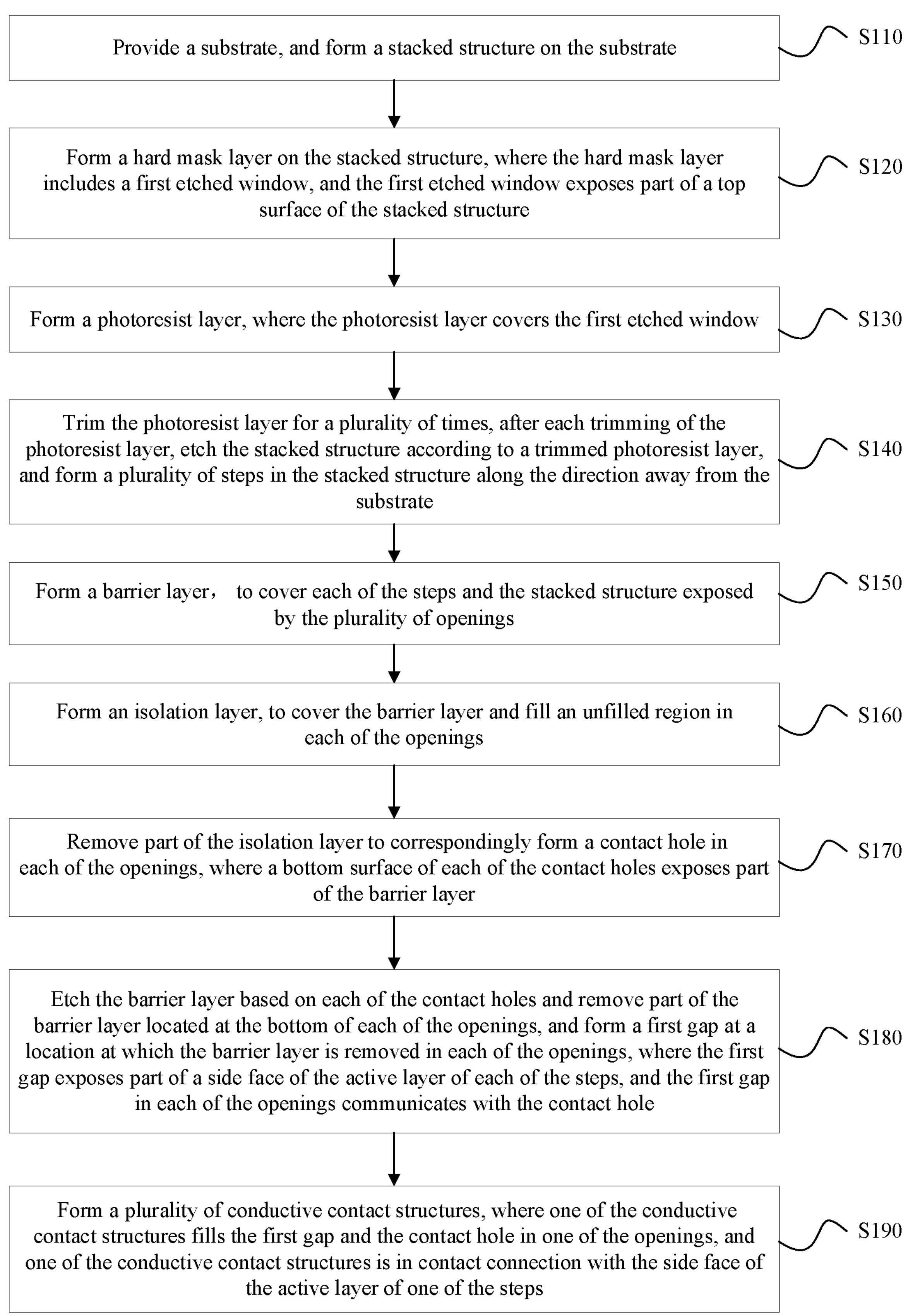
FIG. 1 is a flowchart of a manufacturing method of a semiconductor structure according to an exemplary embodiment.

100. substrate; 110. bottom support layer; 200. stacked structure; 200*a*. initial stacked structure; 210. laminated unit; 210-1. first laminated unit; 210-2. second laminated unit; 210-M-1. laminated unit of $(M-1)^{th}$ layer; 210-M. laminated unit of $M^{th}$ layer; 201. active layer; 202. support layer; 220. first trench; 230. isolation structure; 250. opening; 250-1. first opening; 250-2. second opening; 250-M. $M^{th}$ opening; 260. storage region; 270. step region; 280. barrier layer; 290. isolation layer; 300. hard mask layer; 310. first etched window; 311. sub-window; 311-1. first sub-window; 311-2. second sub-window; 311-M. $M^{th}$ sub-window; 400. step; 500. photoresist layer; 600. channel structure; 710. contact hole; 711. first gap; 720. conductive contact structure;

D1. first direction; D2. second direction.

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A three-dimensional memory includes a plurality of layers of memory cells arranged in a stack. To implement the electrical connection between the memory cells and an external circuit, the three-dimensional memory needs to be etched layer by layer during manufacturing to form a plurality of steps. The memory cells are connected to the outside through a step structure. Currently, a relatively large region is usually designated in the layout of the three-dimensional memory for forming steps. However, as a quantity of layers of the three-dimensional memory increases, an area required by the steps continues to increase, resulting in a decrease in an area for forming a core region of the three-dimensional memory. This is not conducive to improving storage density of the three-dimensional memory. In addition, currently, steps are usually formed by overall etching, and then a support frame of a semiconductor structure is reshaped, resulting in poor stability of an overall structure of the three-dimensional memory.

The present disclosure provides a manufacturing method of a semiconductor structure and a semiconductor structure. A first etched window is defined in a stacked structure through a hard mask layer, a photoresist layer is then formed, the photoresist layer is trimmed for a plurality of times, the stacked structure is etched for a plurality of times according to the trimmed photoresist layer, and then a plurality of steps can be formed in the stacked structure. In this way, an area occupied by the plurality of steps is reduced, and an integration degree of the semiconductor structure is improved, thereby helping improve storage density of the semiconductor structure.

An exemplary embodiment of the present disclosure provides a manufacturing method of a semiconductor structure, as shown in FIG. 1. FIG. 1 is a flowchart of a manufacturing method of a semiconductor structure according to an exemplary embodiment of the present disclosure. FIG. 2 to FIG. 20 are schematic diagrams of various states of a manufacturing method of a semiconductor structure. The manufacturing method of a semiconductor structure is described below with reference to FIG. 2 to FIG. 20.

The semiconductor structure is not limited in this embodiment. The semiconductor structure is described below by using a dynamic random access memory (DRAM) as an example, but this embodiment is not limited thereto. Alternatively, the semiconductor structure in this embodiment may be other structures.

As shown in FIG. 1, an exemplary embodiment of the present disclosure provides a manufacturing method of a semiconductor structure, including the following steps:

Step S110: Provide a substrate, and form a stacked structure on the substrate.

Figure 2:
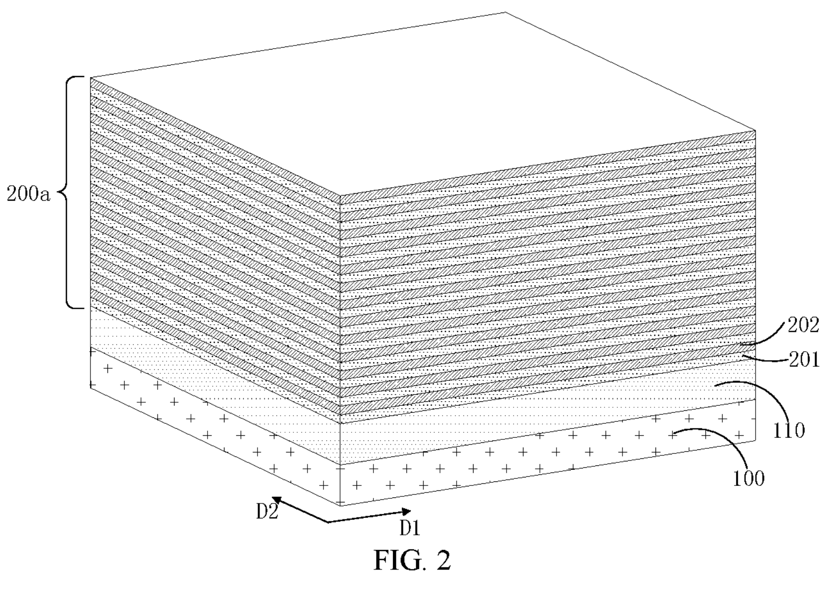
FIG. 2 is a schematic diagram of forming an initial stacked structure according to an exemplary embodiment.
Figure 3:
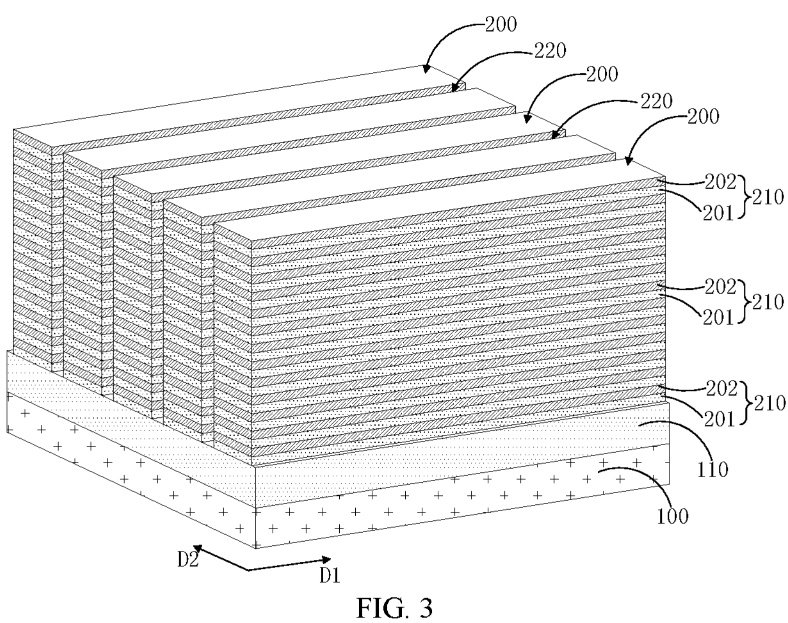
FIG. 3 is a schematic diagram of forming a stacked structure according to an exemplary embodiment.

As shown in FIG. 2 and FIG. 3, the substrate 100 may be a semiconductor substrate. A material of the semiconductor substrate may be silicon (Si), germanium (Ge), silicon-germanium (GeSi), or silicon carbide (SiC); or may be silicon on insulator (SOI) or germanium on insulator (GOI).

In this embodiment, as shown in FIG. 3, one or more stacked structures 200 may be formed on the substrate 100. Each stacked structure 200 includes a plurality of layers of laminated units 210 sequentially laminated on the substrate 100. For example, each stacked structure 200 may include two layers of laminated units 210, 32-layers of laminated units 210, 64-layers of laminated units 210, 128-layers of laminated units 210, or more layers of laminated units 210.

In this embodiment, to form a stacked structure 200 on the substrate 100, the following implementation may be used:

As shown in FIG. 2, first, any deposition process of a chemical vapor deposition (CVD) process, a physical vapor deposition (PVD) process, an atomic layer deposition (ALD) process, or sputtering process may be selectively used to form an active layer 201 on the substrate 100. A material of the active layer 201 may include a semiconductor material. The semiconductor material may be silicon, germanium, silicon-germanium, silicon carbide, silicon on insulator, or germanium on insulator. Alternatively, a material of the active layer 201 may be another material, such as gallium arsenide or other III-V group compounds. In this embodiment, the material of the active layer 201 includes monocrystalline silicon or polycrystalline silicon.

Then, any one of the foregoing deposition processes may be selectively used to deposit a support layer 202 on the active layer 201. A material of the support layer 202 may include at least one of silicon oxide, silicon nitride, or silicon oxynitride.

As shown in FIG. 2, subsequently, the steps of forming the active layer 201 and the support layer 202 are repeated for a plurality of times. The active layers 201 and the support layers 202 are alternately stacked on top of the substrate 100 to form an initial stacked structure 200*a*.

As shown in FIG. 3, referring to FIG. 2, subsequently, part of the initial stacked structure 200*a* is removed by etching, to form a plurality of first trenches 220. The first trench 220 extends along a first direction D1. On a cross section perpendicular to a top surface of the substrate 100, the first trench 220 runs through the initial stacked structure 200*a*. The plurality of first trenches 220 divide the remaining part of the initial stacked structure 200*a* into a plurality of stacked structures 200 which are independently arranged. In a second direction D2, adjacent ones of the stacked structures 200 are separated by the first trench 220. The first direction D1 and the second direction D2 are parallel to the top surface of the substrate 100. The first direction D1 is perpendicular to the second direction D2. As shown in FIG. 3, each of the stacked structures 200 includes an active layer 201 and a support layer 202 that are sequentially laminated on the substrate 100. In the direction away from the substrate 100, the active layer 201 and the support layer 202 located on the active layer 201 in each of the stacked structures 200 are taken as one laminated unit 210.

As shown in FIG. 2, in this embodiment, before the forming a stacked structure 200, the manufacturing method of a semiconductor structure further includes the following step: first forming a bottom support layer 110 by the deposition process. The bottom support layer 110 covers the top surface of the substrate 100. The bottom support layer 110 is arranged between the substrate 100 and the stacked structure 200, such that the stacked structure 200 is electrically isolated from the substrate 100 through the bottom support layer 110. A material of the bottom support layer 110 includes an insulating material. For example, the material of the bottom support layer 110 may include silicon nitride.

Figure 4:
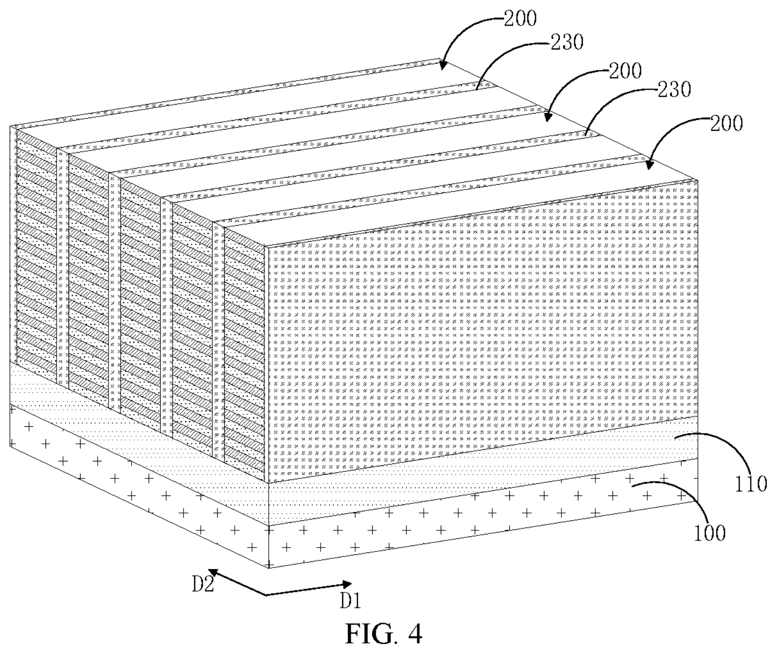
FIG. 4 is a schematic diagram of forming an isolation structure according to an exemplary embodiment.

As shown in FIG. 4, referring to FIG. 3, in this embodiment, after the forming a stacked structure 200, the manufacturing method of a semiconductor structure further includes the following step: depositing an isolation material by using any one of the foregoing deposition processes, and filling the first trench 220 with the isolation material to form an isolation structure 230.

Step S120: Form a hard mask layer on the stacked structure, where the hard mask layer includes a first etched window, and the first etched window exposes part of a top surface of the stacked structure.

Figure 6:
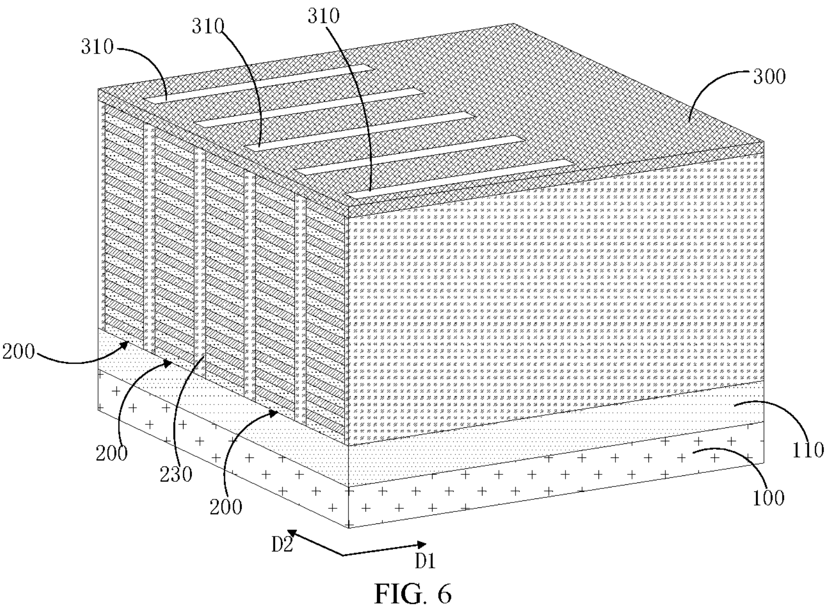
FIG. 6 is a schematic diagram of forming a hard mask layer according to an exemplary embodiment.

As shown in FIG. 6, referring to FIG. 4, in this embodiment, to form a hard mask layer 300 on a top surface of the stacked structure 200, the following implementation may be used:

First, any deposition process of a CVD process, a PVD process, an ALD process, or sputtering process may be selectively used to deposit a hard mask material layer (not shown in the figure). The hard mask material layer covers the top surface of the stacked structure 200 and a top surface of the isolation structure 230.

Then, part of the hard mask material layer is removed by etching to form a first etched window 310 on the top surface of the stacked structure 200. The remaining part of the hard mask material layer forms a hard mask layer 300.

As shown in FIG. 6, in this embodiment, the hard mask layer 300 formed on the stacked structure 200 covers part of the top surface of each of the stacked structures 200 and the top surface of isolation structure 230. The hard mask layer 300 has a plurality of first etched windows 310. Each of the stacked structures 200 is correspondingly provided with at least one first etched window 310.

As shown in FIG. 6, each of the first etched windows 310 extends along the first direction D1. In the second direction D2, a width of the first etched window 310 less than a width of the stacked structure 200. In other words, in the second direction D2, top surfaces of stacked structures 200 located on two sides of the first etched window 310 are covered by the hard mask layer 300, such that a plurality of steps 400 which are subsequently formed (described in detail in subsequent steps) are located in the stacked structure 200. The stacked structure 200 exposes by the first etched window 310 is used to form a plurality of steps 400. The stacked structure 200 covered by the hard mask layer 300 may be used to form other semiconductor structures or devices. For example, the stacked structure 200 covered by the hard mask layer 300 may be used to form a memory cell.

Step S130: Form a photoresist layer, where the photoresist layer covers the first etched window.

Figure 7:
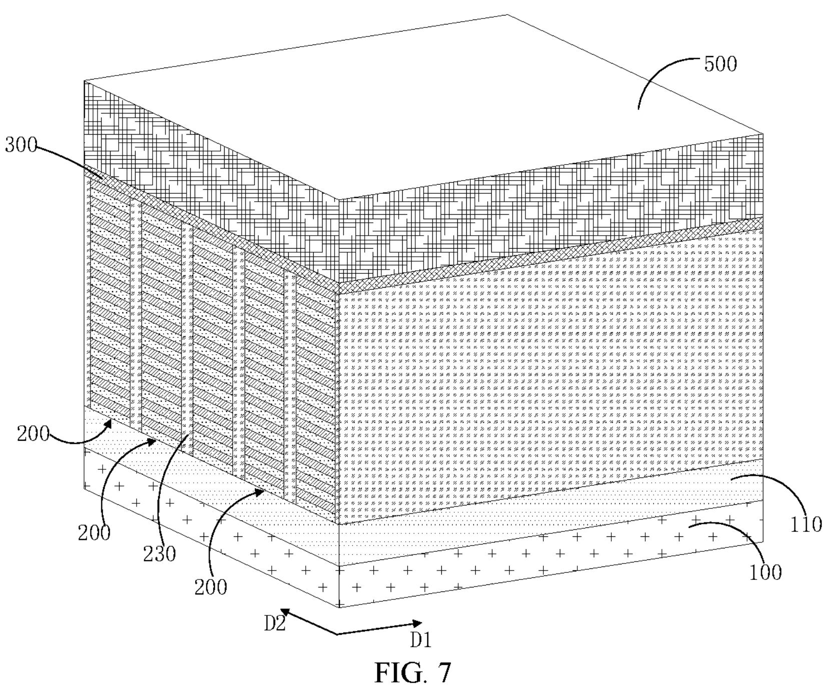
FIG. 7 is a schematic diagram of forming a photoresist layer according to an exemplary embodiment.

As shown in FIG. 7, referring to FIG. 6, a photoresist is coated, and the photoresist covers a top surface of the hard mask layer 300 and fills the first etched window 310. Then, the photoresist is baked to remove part of a solvent in the photoresist to form a photoresist layer 500.

Step S140: Trim the photoresist layer for a plurality of times, after each trimming of the photoresist layer, etch the stacked structure according to a trimmed photoresist layer, and form a plurality of steps in the stacked structure along the direction away from the substrate.

Referring to FIG. 6, FIG. 7, and FIG. 9 to FIG. 15, in this embodiment, the trimming the photoresist layer 500 for a plurality of times, and after each trimming of the photoresist layer 500, etching the stacked structure 200 according to a trimmed photoresist layer 500 includes:

First, the photoresist layer 500 is trimmed to expose part of the first etched window 310.

Then, the stacked structure 200 is etched with the trimmed photoresist layer 500 and the hard mask layer 300 as a mask, part of the stacked structure 200 exposed by the first etched window 310 is removed, and an opening 250 is formed in the stacked structure. In this embodiment, the stacked structure 200 is etched in a direction from the top surface of the stacked structure 200 to the substrate 100. Part of the laminated unit 210 on a top layer of the stacked structure 200 exposed by the trimmed photoresist layer 500 is removed, to expose a top surface of the laminated unit 210 of a next layer, and etching is stopped. An opening 250 is formed in the laminated unit 210 on the top layer of the stacked structure 200.

Subsequently, the steps of trimming the photoresist layer 500, and etching the stacked structure 200 exposed by the first etched window 310 with the trimmed photoresist layer 500 and the hard mask layer 300 as a mask are repeated, and a depth of the formed opening 250 is increased as the stacked structure 200 is etched each time.

Part of the photoresist layer 500 is removed during each trimming of the photoresist layer, to increase a size of the first etched window 310 exposed by the photoresist layer 500, thereby increasing a size of the stacked structure 200 etched according to the trimmed photoresist layer 500. The stacked structure 200 is etched for a plurality of times according to the trimmed photoresist layer 500 to form a plurality of openings 250 in the stacked structure 200, and each time the stacked structure 200 is etched, the formed opening 250 is etched simultaneously. A depth of the formed opening 250 is increased by a thickness of one of the laminated units 210, such that two adjacent ones of the openings 250 have a depth difference, and the retained part of the stacked structure 200 forms a plurality of steps 400.

According to the manufacturing method of this embodiment, a plurality of steps are formed in a stacked structure, such that an area occupied by the plurality of steps is reduced, and an integration degree of the semiconductor structure is improved, thereby helping improve storage density of a semiconductor structure. In addition, widths of the plurality of steps in the second direction are less than a width of the stacked structure in the second direction, and there is no need to etch the stacked structure as a whole, thereby avoiding damage to an architecture of the semiconductor structure during the process of forming the steps by etching. Therefore, there is no need to reshape a support frame of the semiconductor structure, and taking the original architecture of the stacked structure as a support frame, the semiconductor structure has a better support capability and a better toppling resistance capability.

Figure 8:
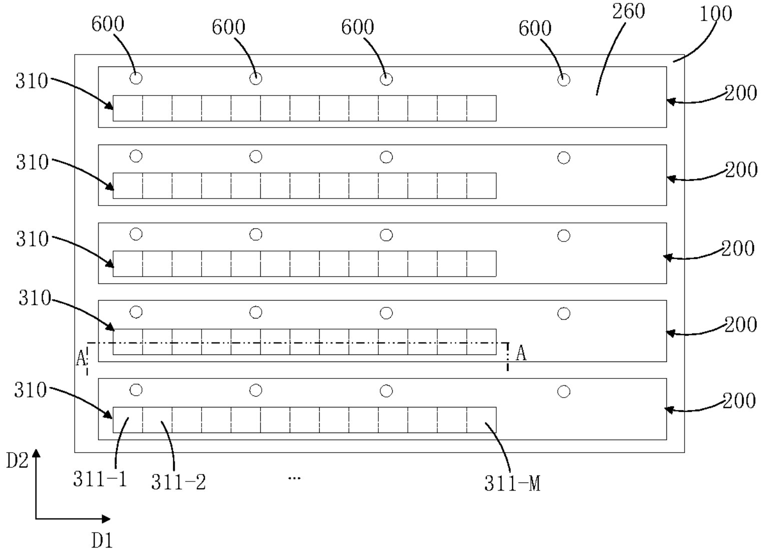
FIG. 8 is a projection drawing of FIG. 7 on a substrate.

According to an exemplary embodiment, this embodiment is a description of the foregoing embodiment. In this embodiment, as shown in FIG. 7 and FIG. 8, the stacked structure 200 includes a storage region 260 and a step region 270. The storage region 260 extends along the first direction D1. The step region 270 is arranged in the storage region 260 along the first direction D1. The first etched window 310 exposes a top surface of the stacked structure 200 located in the step region 270. In this embodiment, the storage region 260 is used for forming a memory cell, and the step region 270 is used for forming a plurality of steps 400. Each layer of memory cell in the storage region 260 may be led out through each step 400 arranged in the same layer, to be connected to other structures, devices, or external circuits, without reserving a separate region in the semiconductor structure to form the steps 400 (refer to FIG. 14). In this way, the layout of the semiconductor structure is more compact, thereby increasing an available area of the storage region 260 in the semiconductor structure, and improving utilization of the semiconductor structure.

Figure 5:
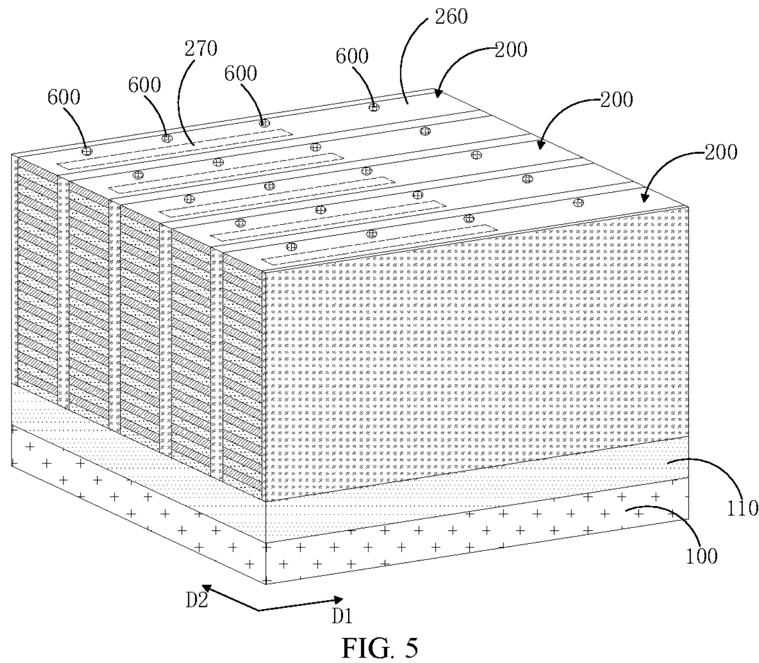
FIG. 5 is a schematic diagram of forming a channel structure in a storage region according to an exemplary embodiment.

In some embodiments, as shown in FIG. 5 and FIG. 8, referring to FIG. 4, before the hard mask layer 300 is formed, the manufacturing method of a semiconductor structure may further include the following step: etching the storage region 260 to form a plurality of channel holes (not shown in the figure) in the storage region 260. The channel holes run through the stacked structure 200. The plurality of channel holes are arranged along the first direction D1. Then, a channel structure 600 is correspondingly formed in one of the channel holes. The channel structure 600 runs through the stacked structure 200. As shown in FIG. 5 and FIG. 8, the step region 270 is located on one side of the plurality of channel structures 600. After the hard mask layer 300 is formed, the hard mask layer 300 covers top surfaces of the plurality of channel structures 600.

In this embodiment, after the photoresist layer 500 is formed, before the stacked structure 200 is etched, the manufacturing method of a semiconductor structure further includes the following steps:

Referring to FIG. 8, from a first end of the first etched window 310 to a second end of the first etched window 310, the first etched window 310 is divided into a plurality of sub-windows 311 arranged along the first direction D1.

Figure 9:
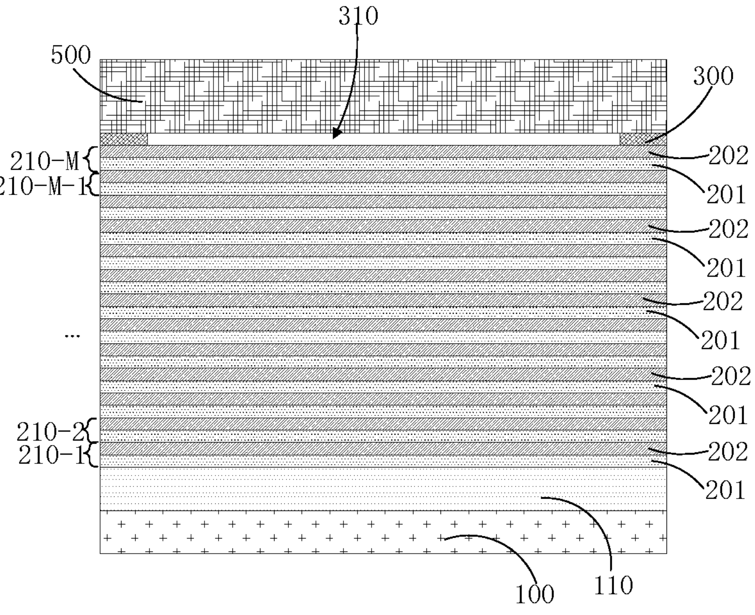
FIG. 9 is a cross-sectional view taken along A-A in FIG. 7.

As shown in FIG. 8 and FIG. 9, in this embodiment, the first etched window 310 is equally divided according to the stacked structure 200 into a plurality of sub-windows 311 arranged along the first direction D1. A quantity of the sub-windows 311 is the same as a quantity of the laminated units 210, ensuring that steps 400 can be formed in the laminated unit 210 of each layer (refer to FIG. 14). The laminated unit 210 of each layer can be led out through the steps 400 arranged in the same layer. For example, along the direction away from the substrate 100, the stacked structure 200 includes M layers of laminated units 210 stacked sequentially, which are sequentially: a first laminated unit 210-1, a second laminated unit 210-2, . . . , and a laminated unit of an $M^{th}$ layer 210-M along the direction away from the substrate 100, and M is an integer greater than 2. In this case, from the first end of the first etched window 310 to the second end of the first etched window 310, the first etched window 310 includes M sub-windows 311 arranged sequentially: a first sub-window 311-1, a second sub-window 311-2, . . . , and an $M^{th}$ sub-window 311-M.

In this embodiment, for trimming the photoresist layer 500 for a plurality of times, after each trimming of the photoresist layer 500, etching the stacked structure 200 according to the trimmed photoresist layer 500, and forming a plurality of steps 400 in the stacked structure 200 along the direction away from the substrate 100, the following implementation is used.

Figure 10:
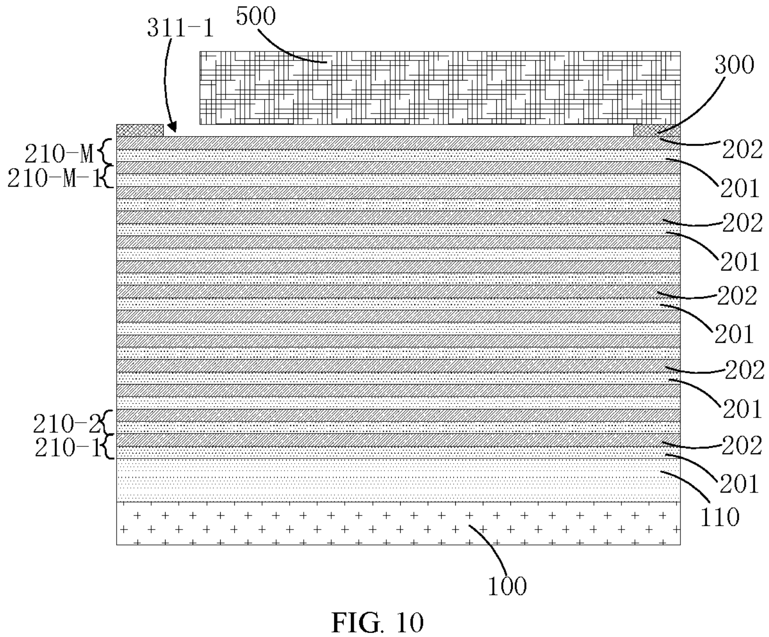
FIG. 10 is a cross-sectional view taken along A-A of a first sub-window exposed by trimming a photoresist layer according to an exemplary embodiment.

As shown in FIG. 10, referring to FIG. 8 and FIG. 9, first, a side face of the photoresist layer 500 is etched through a first process to remove part of the photoresist layer 500, and a width of the photoresist layer 500 in the first direction D1 is reduced to expose the first sub-window 311-1. The first process may be an anisotropic plasma dry etching process.

Figure 11:
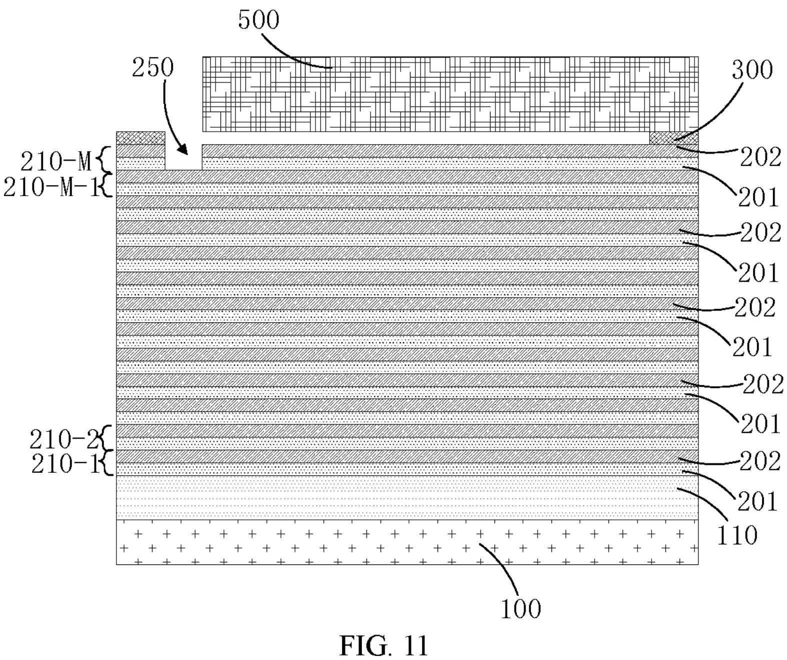
FIG. 11 is a cross-sectional view taken along A-A of a stacked structure exposed by etching a first sub-window according to an exemplary embodiment.

As shown in FIG. 11, referring to FIG. 10, then, the stacked structure 200 is etched according to the trimmed photoresist layer 500 to remove the laminated unit of an $M^{th}$ layer 210-M exposed by the first sub-window 311-1, to expose the laminated unit of an $(M-1)^{th}$ layer 210-M−1, and etching is stopped. An opening 250 is formed in the laminated unit of the $M^{th}$ layer 210-M.

Figures 12, 13:
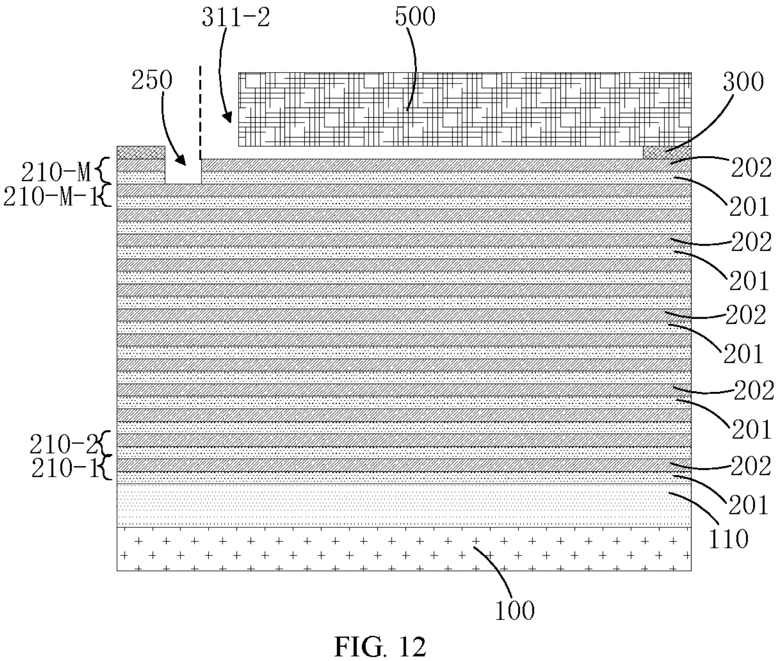
FIG. 12 is a cross-sectional view taken along A-A of a second sub-window exposed by trimming a photoresist layer according to an exemplary embodiment.
FIG. 13 is a cross-sectional view taken along A-A of a second sub-window exposed by etching a second sub-window according to an exemplary embodiment.
Figure 14:
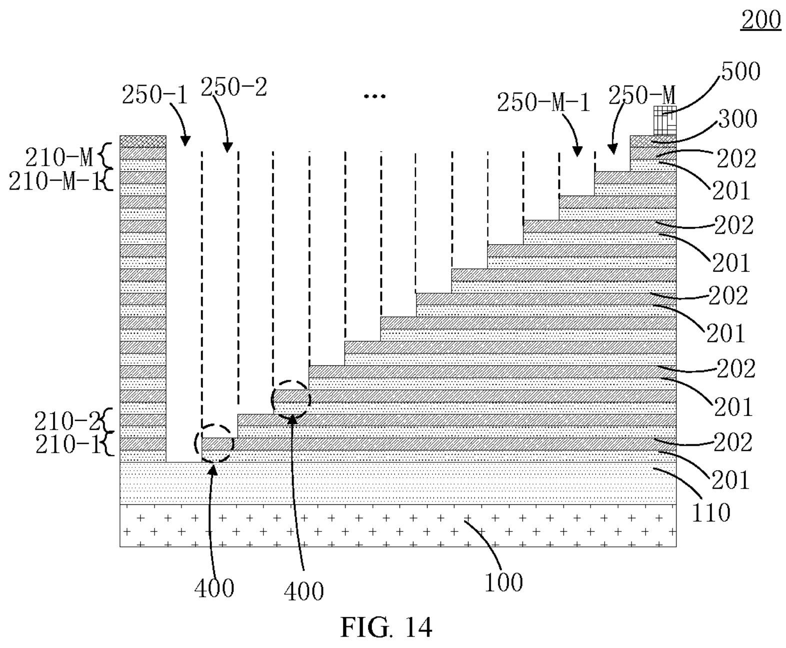
FIG. 14 is a cross-sectional view taken along A-A of forming a plurality of steps according to an exemplary embodiment.
Figure 15:
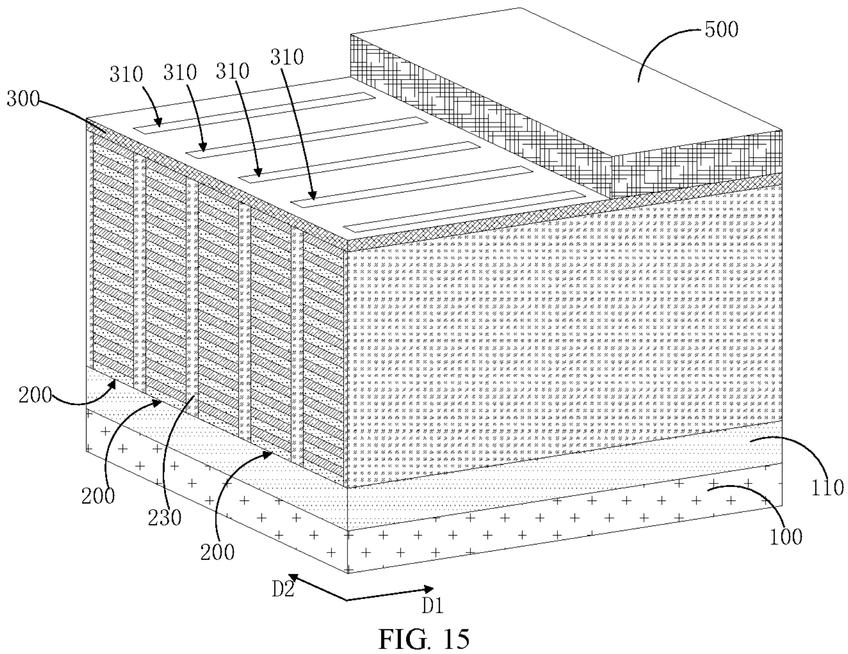
FIG. 15 is a schematic diagram of a first etched window exposed by a photoresist layer according to an exemplary embodiment.

Then, the steps of trimming the photoresist layer 500, and etching the stacked structure 200 according to the photoresist layer 500 are repeated. As shown in FIG. 12, referring to FIG. 8 and FIG. 11, part of the photoresist layer 500 is removed through trimming to reduce the width of the photoresist layer 500 in the first direction D1, to expose the second sub-window 311-2, as shown in FIG. 13. Referring to FIG. 12, the stacked structure 200 is etched, an opening 250 is formed in the laminated unit of the $M^{th}$ layer 210-M exposed in the second sub-window 311-2, and the opening 250 corresponding to the first sub-window 311-1 is deepened. Subsequently, the photoresist layer 500 is sequentially trimmed from the first end of the first etched window 310 to the second end of the first etched window 310, a width of the photoresist layer 500 in the first direction D1 is gradually reduced, and each of the sub-windows 311 of the first etched window 310 are sequentially exposed. In addition, the stacked structure 200 is etched according to the photoresist layer 500 after each trimming of the photoresist layer, to form a plurality of openings 250 in the stacked structure 200. As shown in FIG. 14 and FIG. 15, the plurality of openings 250 and the plurality of sub-windows 311 are arranged in a one-to-one correspondence from the first end of the first etched window 310 to the second end of the first etched window 310. Depths of the plurality of openings 250 sequentially decrease. Two adjacent ones of the openings 250 form a single step 400 in the stacked structure 200. The plurality of steps 400 are raised step by step along the direction away from the substrate 100.

As shown in FIG. 14, referring to FIG. 5, in this embodiment, M openings 250 sequentially arranged along the first direction D1 are formed in the step region 270, and M openings 250 are sequentially taken as: a first opening 250-1, a second opening 250-2, . . . , and an $M^{th}$ opening 250-M. The first opening 250-1 extends to the first laminated unit 210-1 to form the step 400 in the first laminated unit 210-1; the second opening 250-2 extends to the second laminated unit 210-2 to form the step 400 in the second laminated unit 210-2; . . . and the $M^{th}$ opening 250-M extends to the $M^{th}$ laminated unit 210-M to form the step 400 in the $M^{th}$ laminated unit 210-M. In other words, the step 400 is formed in the laminated unit 210 of each layer in the step region 270, and a structure of each layer in the storage region 260 can be led out through the step 400 arranged in the same layer, to be connected to other structures, devices, or external circuits.

According to an exemplary embodiment, this embodiment is a description of the foregoing embodiment. As shown in FIG. 14, along the direction away from the substrate 100, each of the steps 400 includes the active layer 201 and the support layer 202 that are laminated. A side face of each of the steps 400 includes a side face of the active layer 201 and a side face of the support layer 202. In this embodiment, after a plurality of steps 400 are formed, the manufacturing method of a semiconductor structure further includes the following steps:

Step S150: Form a barrier layer, to cover each of the steps and the stacked structure exposed by the plurality of openings.

Figures 16, 17:
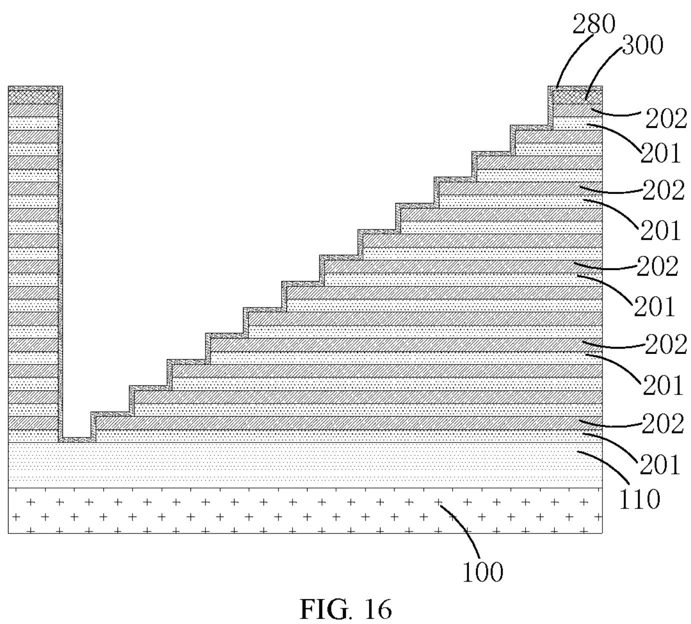
FIG. 16 is a cross-sectional view taken along A-A of forming a barrier layer according to an exemplary embodiment.
FIG. 17 is a cross-sectional view taken along A-A of forming an isolation layer according to an exemplary embodiment.

As shown in FIG. 16, referring to FIG. 14, any deposition process of a CVD process, a PVD process, an ALD process, or sputtering process may be selectively used to deposit a barrier material. The barrier material covers a side face of each of the steps 400, a top surface of each of the steps 400, the stacked structure 200 exposed by the plurality of openings 250, and a top surface of the hard mask layer 300, to form a barrier layer 280. The material of the barrier layer 280 may include at least one of silicon oxide, silicon nitride, or silicon oxynitride.

Step S160: Form an isolation layer, to cover the barrier layer and fill an unfilled region in each of the openings.

As shown in FIG. 17, referring to FIG. 14 and FIG. 16, any one of the foregoing deposition processes may be selectively used to deposit an isolation material to form an isolation layer 290. The isolation layer 290 covers the barrier layer 280 and fills the unfilled region in each of the openings 250. The material of the isolation layer 290 may include at least one of silicon oxide, silicon nitride, or silicon oxynitride. The material of the isolation layer 290 is different from the material of the barrier layer 280, and the material of the isolation layer 290 has a higher etch selectivity than the material of the barrier layer 280.

Step S170: Remove part of the isolation layer to correspondingly form a contact hole in each of the openings, where a bottom surface of each of the contact holes exposes part of the barrier layer.

Figures 18, 19:
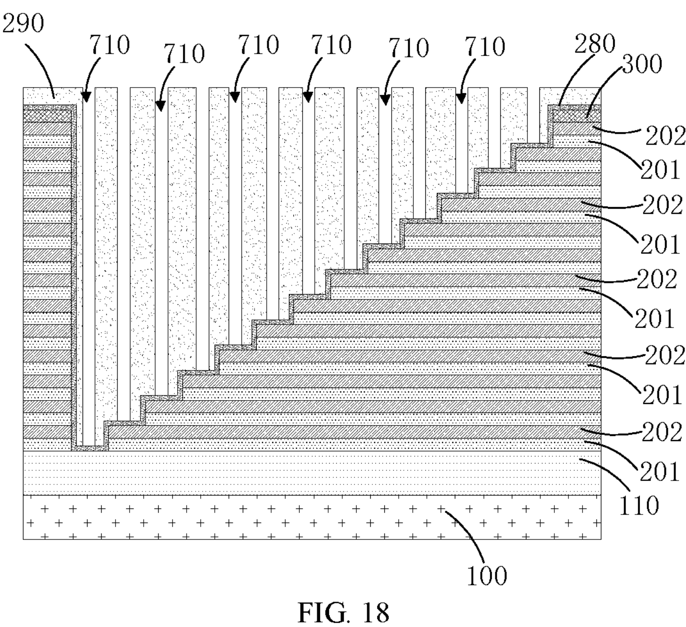
FIG. 18 is a cross-sectional view taken along A-A of forming a contact hole according to an exemplary embodiment.
FIG. 19 is a cross-sectional view taken along A-A of forming a first gap according to an exemplary embodiment.

As shown in FIG. 18, referring to FIG. 17, a mask layer (not shown in the figure) is formed on a top surface of the isolation layer 290. Part of the isolation layer 290 located in each of the openings 250 is removed by etching according to the mask layer (refer to FIG. 14). A contact hole 710 is correspondingly formed in each of the openings 250. The contact hole 710 exposes the barrier layer 280 located on a bottom wall of the opening 250.

Step S180: Etch the barrier layer based on each of the contact holes and remove part of the barrier layer located at the bottom of each of the openings, and form a first gap at a location at which the barrier layer is removed in each of the openings, where the first gap exposes part of a side face of the active layer of each of the steps, and the first gap in each of the openings communicates with the contact hole.

As shown in FIG. 19, referring to FIG. 14 and FIG. 18, an etching solution may be injected into the contact hole 710, and the barrier layer 280 located on the bottom wall of each of the openings 250 and a portion of the barrier layer 280 connected thereto dissolve in the etching solution. Then, the etching solution is removed, and a first gap 711 is formed at a location at which the barrier layer 280 is removed in each of the openings 250. The first gap 711 communicates with the contact hole 710. The first gap 711 in each of the openings 250 exposes at least part of a sidewall of the active layer 201 of one of the steps 400. For example, as shown in FIG. 19, referring to FIG. 14, the first gap 711 in the first opening 250-1 exposes part of a sidewall of the active layer 201 of the steps 400 arranged in the first laminated unit 210-1. The first gap 711 in the second opening 250-2 exposes part of a sidewall of the active layer 201 of the steps 400 arranged in the second laminated unit 210-2.

It can be understood that, the first gap 711 may expose the entire sidewall of the active layer 201 of one of the steps 400 and part of the sidewall of the support layer 202. However, a top surface of the first gap 711 is lower than a top surface of the step 400 adjacent thereto, ensuring that subsequently formed conductive contact structures 720 (described in detail in the subsequent step) are separated through the isolation layer 290, to avoid short-circuit of adjacent ones of the conductive contact structures 720 caused by an extremely small distance, and to avoid impact on electrical performance of the semiconductor structure.

Step S190: Form a plurality of conductive contact structures, where one of the conductive contact structures fills the first gap and the contact hole in one of the openings, and one of the conductive contact structures is in contact connection with the side face of the active layer of one of the steps.

Figure 20:
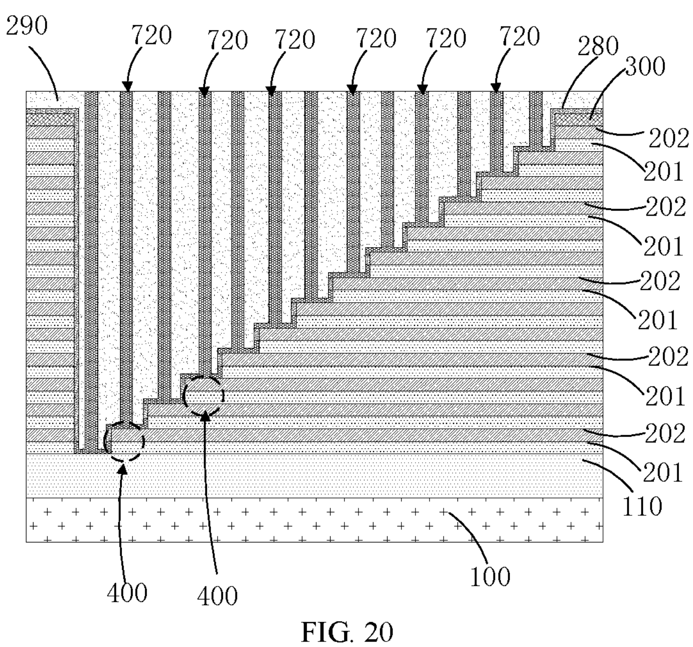
FIG. 20 is a cross-sectional view taken along A-A of forming a conductive contact structure according to an exemplary embodiment.

As shown in FIG. 20, referring to FIG. 19, any deposition process of a CVD process, a PVD process, an ALD process, or sputtering process may be selectively used to deposit a conductive material. The conductive material fills each of the contact holes 710 and each of the first gaps 711 that communicates with the contact hole 710, to form a plurality of conductive contact structures 720. The conductive contact structure 720 covers part of a side face of the active layer 201 exposed by the first gap 711. In other words, the plurality of conductive contact structures 720 and the plurality of steps 400 are in a one-to-one correspondence. Each of the conductive contact structures 720 is in contact connection with the active layer 201 of the step 400 corresponding thereto.

Currently, the conductive contact structure is usually provided in such a manner that it runs through one of the steps to be connected to the active layer in the step. In the process of forming a conductive contact structure, the support layer needs to be etched to expose a top surface of the active layer. According to the manufacturing method of this embodiment, the formed conductive contact structure is connected to the side face of the active layer of one of the steps, thereby preventing etching of the support layer in the step from damaging the support frame of the stacked structure, and preventing the active layer from being damaged in the process of etching of the support layer, thereby ensuring that the formed semiconductor structure has good stability.

According to an exemplary embodiment, this embodiment provides a semiconductor structure. The semiconductor structure is manufactured according to the manufacturing method of a semiconductor structure in the foregoing embodiment. As shown in FIG. 14 and FIG. 15, the semiconductor structure includes a substrate 100 and a stacked structure 200. The stacked structure 200 is arranged on the substrate 100. A plurality of steps 400 are arranged in the stacked structure 200 along the direction away from the substrate 100. The plurality of steps 400 are arranged in the stacked structure 200, such that an area occupied by the steps 400 in the semiconductor structure is reduced. In this way, the layout of the semiconductor structure is more compact, thereby helping improve storage density of the semiconductor structure.

In some embodiments, as shown in FIG. 14 and FIG. 15, the plurality of steps 400 are arranged along a first direction D1 and the plurality of steps 400 are raised step by step along the direction away from the substrate 100. In a second direction D2, a width of the step 400 is less than a width of the stacked structure 200. The first direction D1 and the second direction D2 are parallel to a top surface of the substrate 100. The first direction D1 is perpendicular to the second direction D2.

In some embodiments, as shown in FIG. 14 and FIG. 15, referring to FIG. 5 and FIG. 8, the stacked structure 200 includes a storage region 260 and a step region 270. The storage region 260 extends along the first direction D1. The step region 270 is arranged in the storage region 260 along the first direction D1. The plurality of steps 400 are arranged in the step region 270 along the first direction D1. In this embodiment, the step region 270 is arranged in the storage region 260, the plurality of steps 400 are arranged in the step region 270, and a structure of each layer in the storage region 260 can be led out through the steps 400 arranged in the same layer, to be connected to other structures, devices, or external circuits.

In some embodiments, as shown in FIG. 14 and FIG. 15, the stacked structure 200 further includes a plurality of openings 250. The plurality of openings 250 are arranged along the first direction D1, and depths of the plurality of openings 250 sequentially decrease. Two adjacent ones of the openings 250 form a single step 400 in the stacked structure 200.

In some embodiments, as shown in FIG. 20, referring to FIG. 14, along the direction away from the substrate 100, each of the steps 400 includes an active layer 201 and a support layer 202 that are laminated. A side face of each of the steps 400 includes a side face of the active layer 201 and a side face of the support layer 202. The semiconductor structure further includes a plurality of conductive contact structures 720. One of the conductive contact structures 720 is correspondingly arranged in one of the openings 250. One of the conductive contact structures 720 is in contact connection with the side face of the active layer 201 of one of the steps 400. The conductive contact structure 720 is connected to the step 400, such that the structure of each layer in the storage region 260 is led out through the conductive contact structure 720.

In some embodiments, the semiconductor structure further includes a barrier layer 280 and an isolation layer 290. The barrier layer 280 covers a top surface of each of the steps 400 and a side face of the support layer 202 of each of the steps 400. The isolation layer 290 covers the barrier layer 280 and an outer peripheral surface of the conductive contact structure 720 and fills an unfilled region in each of the openings 250.

In the semiconductor structure of this embodiment, a plurality of steps 400 are arranged in the storage region 260, and the structure of each layer in the storage region 260 can be connected to the conductive contact structure 720 through the step 400 arranged in the same layer and then led out through the conductive contact structure 720 to be connected to other structures, devices, or external circuits, without reserving a dedicated region in the semiconductor structure for the steps 400. In this way, the layout of the semiconductor structure is more compact, thereby increasing an area of the semiconductor structure for the storage region 260, improving utilization of the semiconductor structure, and helping improve storage density of the semiconductor structure.

The semiconductor structure of this embodiment may be applied to a DRAM. However, the semiconductor structure may alternatively be applied to a static random-access memory (SRAM), a flash memory (flash EPROM), a ferroelectric random-access memory (FRAM), a magnetic random-access memory (MRAM), a phase change random-access memory (PRAM), or the like.

The embodiments or implementations of this specification are described in a progressive manner, and each embodiment focuses on differences from other embodiments. The same or similar parts between the embodiments may refer to each other.

In the description of this specification, the description referring to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail referring to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the manufacturing method of a semiconductor structure and the semiconductor structure provided in the present disclosure, a first etched window is defined in a stacked structure through a hard mask layer, a photoresist layer is trimmed for a plurality of times, the stacked structure exposed by the first etched window is etched for a plurality of times according to the trimmed photoresist layer, and then a plurality of steps can be formed in the stacked structure. In this way, an area occupied by the plurality of steps is reduced, and an integration degree of the semiconductor structure is improved, thereby helping improve storage density of the semiconductor structure.

The invention claimed is:

1. A manufacturing method of a semiconductor structure, comprising:

providing a substrate, and forming a stacked structure on the substrate;

forming a hard mask layer on the stacked structure, wherein the hard mask layer comprises a first etched window, and the first etched window exposes part of a top surface of the stacked structure;

forming a photoresist layer, wherein the photoresist layer covers the first etched window; and trimming the photoresist layer for a plurality of times, after each trimming of the photoresist layer, etching the stacked structure according to a trimmed photoresist layer, and forming a plurality of steps in the stacked structure along a direction away from the substrate; wherein the first etched window extends along a first direction;

in a second direction, a width of the first etched window is less than a width of the stacked structure;

the first direction and the second direction are parallel to a top surface of the substrate, and the first direction is perpendicular to the second direction;

the manufacturing method of a semiconductor structure further comprising:

from a first end of the first etched window to a second end of the first etched window, dividing the first etched window into a plurality of sub-windows arranged along the first direction; and sequentially trimming the photoresist layer from the first end of the first etched window to the second end of the first etched window, gradually reducing a width of the photoresist layer in the first direction each time, and sequentially exposing each of the sub-windows of the first etched window; wherein the stacked structure is etched according to a trimmed photoresist layer after each trimming of the photoresist layer, to form a plurality of openings in the stacked structure;

the plurality of openings and the plurality of sub-windows are arranged in a one-to-one correspondence from the first end of the first etched window to the second end of the first etched window, depths of the plurality of openings sequentially decrease, two adjacent ones of the openings form one of the steps in the stacked structure, and the plurality of steps are raised step by step along the direction away from the substrate.

2. The manufacturing method of a semiconductor structure according to claim 1, wherein the stacked structure comprises a storage region and a step region, the storage region extends along the first direction, the step region is arranged in the storage region along the first direction, and the first etched window exposes a top surface of the stacked structure located in the step region.

3. The manufacturing method of a semiconductor structure according to claim 1, wherein the trimming the photoresist layer for a plurality of times, and after each trimming of the photoresist layer, etching the stacked structure according to a trimmed photoresist layer comprises:

trimming the photoresist layer to expose part of the first etched window;

etching the stacked structure with the trimmed photoresist layer and the hard mask layer as a mask, removing part of the stacked structure exposed by the first etched window, and forming an opening in the stacked structure; and repeating the steps of trimming the photoresist layer and etching the stacked structure exposed by the first etched window with the trimmed photoresist layer and the hard mask layer as a mask, wherein a depth of a formed opening is increased as the stacked structure is etched each time.

4. The manufacturing method of a semiconductor structure according to claim 3, wherein the stacked structure comprises a plurality of layers of laminated units sequentially laminated on the substrate, and the etching the stacked structure with the trimmed photoresist layer and the hard mask layer as a mask comprises:

etching and removing part of the laminated unit located on a top layer of the stacked structure to expose a top surface of the laminated unit of a next layer and stopping etching;

wherein the depth of the formed opening is increased by a thickness of one of the laminated units, as the stacked structure is etched each time.

5. The manufacturing method of a semiconductor structure according to claim 4, wherein along the direction away from the substrate, the laminated unit of each layer comprises an active layer and a support layer that are laminated sequentially, each of the steps formed in the stacked structure comprises the active layer and the support layer that are laminated, and a side face of each of the steps comprises a side face of the active layer and a side face of the support layer.

6. The manufacturing method of a semiconductor structure according to claim 5, further comprising:

forming a barrier layer, to cover each of the steps and the stacked structure exposed by the plurality of openings; and forming an isolation layer to cover the barrier layer and to fill an unfilled region in each of the openings.

7. The manufacturing method of a semiconductor structure according to claim 6, further comprising:

removing part of the isolation layer to correspondingly form a contact hole in each of the openings, wherein a bottom surface of each of the contact holes exposes part of the barrier layer;

etching the barrier layer based on each of the contact holes to remove part of the barrier layer located at the bottom of each of the openings, and forming a first gap at a location at which the barrier layer is removed in each of the openings, wherein the first gap exposes part of a side face of the active layer of each of the steps, and the first gap in each of the openings communicates with the contact hole; and forming a plurality of conductive contact structures, wherein one of the conductive contact structures fills the first gap and the contact hole in one of the openings, and one of the conductive contact structures is in contact connection with the side face of the active layer of one of the steps.

8. A semiconductor structure, wherein the semiconductor structure is manufactured according to the manufacturing method of a semiconductor structure according to claim 1, and the semiconductor structure comprises:

a substrate; and a stacked structure arranged on the substrate, wherein a plurality of steps are arranged in the stacked structure along a direction away from the substrate; wherein the plurality of steps are arranged along a first direction and the plurality of steps are raised step by step along the direction away from the substrate;

in a second direction, a width of the step is less than a width of the stacked structure; the first direction and the second direction are parallel to a top surface of the substrate, and the first direction is perpendicular to the second direction; wherein the stacked structure further comprises:

a plurality of openings, wherein the plurality of openings are arranged along the first direction, depths of the plurality of openings sequentially decrease, and two adjacent ones of the openings form one of the steps in the stacked structure.

9. The semiconductor structure according to claim 8, wherein the stacked structure comprises a storage region and a step region, the storage region extends along the first direction, the step region is arranged in the storage region along the first direction, and the plurality of steps are arranged in the step region along the first direction.

10. The semiconductor structure according to claim 8, wherein along the direction away from the substrate, each of the steps comprises an active layer and a support layer that are laminated, and a side face of each of the steps comprises a side face of the active layer and a side face of the support layer; and the semiconductor structure further comprises:

a plurality of conductive contact structures, wherein one of the conductive contact structures is correspondingly arranged in one of the openings, and one of the conductive contact structures is in contact connection with the side face of the active layer of one of the steps.

* * * * *